United States Patent
Buckley et al.

(10) Patent No.: US 9,184,958 B2
(45) Date of Patent: Nov. 10, 2015

(54) SYSTEM AND METHOD OF ENCODING AND TRANSMITTING CODEWORDS

(71) Applicant: Research In Motion Limited, Waterloo (CA)

(72) Inventors: Michael Eoin Buckley, Rolling Meadows, IL (US); Ebad Ahmed, Ithaca, NY (US); Yufei Wu Blankenship, Rolling Meadows, IL (US); Chandra Sekhar Bontu, Ottawa (CA); Shalini Suresh Periyalwar, Waterloo (CA); Yan Xin, Ottawa (CA)

(73) Assignee: BlackBerry Limited, Waterloo, Ontario (CA)

( * ) Notice: Subject to any disclaimer, the term of this patent is extended or adjusted under 35 U.S.C. 154(b) by 434 days.

(21) Appl. No.: 13/673,954

(22) Filed: Nov. 9, 2012

(65) Prior Publication Data
US 2013/0114759 A1    May 9, 2013

Related U.S. Application Data

(63) Continuation of application No. PCT/US2011/059633, filed on Nov. 7, 2011.

(51) Int. Cl.
| | |
|---|---|
| *H03M 13/00* | (2006.01) |
| *H04L 27/04* | (2006.01) |
| *H04L 1/00* | (2006.01) |
| *H04L 1/18* | (2006.01) |

(Continued)

(52) U.S. Cl.
CPC .............. *H04L 27/04* (2013.01); *H03M 13/23* (2013.01); *H03M 13/2957* (2013.01); *H03M 13/6306* (2013.01); *H04L 1/0041* (2013.01); *H04L 1/0059* (2013.01); *H04L 1/0066* (2013.01); *H04L 1/0076* (2013.01); *H04L 1/1819* (2013.01); *H04L 2001/0096* (2013.01)

(58) Field of Classification Search
CPC ..... H04L 27/04; H04L 1/0066; H04L 1/0041; H04L 1/0059; H04L 1/0076; H04L 1/1819; H03M 13/23; H03M 13/2957; H03M 13/606; H03M 13/0096
See application file for complete search history.

(56) References Cited

U.S. PATENT DOCUMENTS

| | | | |
|---|---|---|---|
| 7,421,644 B2 | 9/2008 | Mantha et al. | |
| 7,843,888 B1* | 11/2010 | Wang et al. | 370/334 |
| 2003/0058954 A1* | 3/2003 | He | 375/262 |

FOREIGN PATENT DOCUMENTS

| | | | |
|---|---|---|---|
| EP | 0820159 A2 | 1/1998 | |
| EP | 1056236 A2 | 11/2000 | |

OTHER PUBLICATIONS

S. Periyalwar, M. Pecen, D. Steer, "Methods to Enable Efficient Use of Multiple Radio Access Technologies", PCT/CA2011/050476, filed Aug. 4, 2011.

(Continued)

*Primary Examiner* — Sam Rizk
(74) *Attorney, Agent, or Firm* — Fish & Richardson P.C.

(57) ABSTRACT

Systems and methods are provided for encoding and transmitting codewords. A message is encoded in two encoders. For at least one of the two encoders, the message is algebraically modified prior to being encoded. In a specific example, the message is algebraically modified prior to being encoded in each of two traditionally non-systematic encoders, with the result that the output is equivalent to that of a turbo encoder.

22 Claims, 10 Drawing Sheets

(51) Int. Cl.
*H03M 13/23* (2006.01)
*H03M 13/29* (2006.01)

(56) References Cited

OTHER PUBLICATIONS

S. Dolinar, D. Divsalar, A. Kiely, F. Pollara, "Performance-Complexity Tradeoffs for Turbo and Turbo-like Codes", ISIT 2001, pp. 101, Washington, Jun. 2001.
G. Koudouridis, A. Yaver, M. Khattak, "Performance Evaluation of Multi-Radio Transmission Diversity for TCP Flows", IEEE 2009.
J. Olmos, S. Ruiz, "Transport Block Error Rates for UTRA-FDD Downlink with Transmission Diversity and Turbo Coding", In 13th IEEE International Symposium on Personal Indoor and Mobile Radio Communications, PIMRC 2002, Proceedings (Cat. No. 02TH8637), vol. 1 (2002).
Fu-hua Huang, Chapter 3. Turbo Code Encoder, pp. 24-37; May 29, 1997.
The International Search report and the Written Opinion mailed Jul. 26, 2012, in corresponding PCT patent application No. PCT/US2011/059633.
Bolinth E: "Algorithm to convert non-systematic reed-forward convolutional codes of rate R=K/N to recursive systematic codes", International OFDM workshop, XX, XX Aug. 31, 2005, pp. 1-06, XP009064405, the whole document.

* cited by examiner

SYSTEM AND METHOD OF ENCODING AND TRANSMITTING CODEWORDS

This application is a continuation of PCT Application No. PCT/US2011/059633 filed Nov. 7, 2011, which is hereby incorporated by reference in its entirety.

FIELD

The application relates to systems and methods of encoding and transmitting codewords.

BACKGROUND

Radio signals suffer from high variability in signal quality due to effects such as propagation loss, fading and interference. Although radio link quality is robust in general for most types of applications ranging from delay sensitive voice to delay tolerant data, it is not uncommon for the radio link to experience outage, manifested by dropped calls or intolerable transmission error rates. Methods used to decrease outage probability and improve reliability with a single radio link are well known. These include forward error correction and HARQ (hybrid automatic repeat request).

It is common to find multiple RAT (radio access technology) transceivers in a wireless device; it is also common to find that at any given location, it is possible to access multiple RAT networks (due to overlapping coverage areas). For example, currently most wireless handset devices support both a GSM/GPRS (Global System for Mobile Communications/General packet radio service) and a UMTS (Universal Mobile Telecommunications System) interface. Often these devices attempt to maximize coverage by accessing the best available RAT. The carrier frequency used for GSM/GPRS operation is in the 900 MHz range while the carrier frequency used for UMTS operation is in the 1.9 GHz range. The two systems are thus substantially separated in carrier frequency and are unlikely to simultaneously suffer deep fades across the respective frequency bands of operation. In some cases, the wireless link (transmit, receive) endpoints (wireless device, base station) are collocated since the services are provided by the same operator, e.g., GSM/GPRS, UMTS. At any given location and time instant, it is possible that coverage is available for multiple RATs.

SUMMARY

According to one broad aspect, the application provides a method comprising: performing a first encoding of a first message to produce a first codeword where the first message is related to and has the same length as an original message; generating a second message by at least algebraically modifying a third message, the second message having the same length as the original message, and the third message is related to and has the same length as the original message; performing a second encoding of the second message to produce a second codeword; and transmitting at least part of the first codeword and transmitting at least part of the second codeword.

In some embodiments, the third message is the original message.

In some embodiments, generating the second message comprises interleaving the original message to produce the third message.

In some embodiments, performing a first encoding comprises using a non-recursive convolutional encoder and performing a second encoding comprises using a non-recursive convolutional encoder.

In some embodiments, generating the second message and performing the second encoding of the second message to produce a second codeword are performed such that the second codeword is the same as what would have been obtained by encoding the third message with a recursive systematic code.

In some embodiments, generating the first message by at least performing algebraically modifying a fourth message, wherein the fourth message has the same length as the original message.

In some embodiments, the fourth message is the original message.

In some embodiments, generating the first message comprises interleaving the original message to produce the fourth message.

In some embodiments, generating the first message and performing the first encoding of the first message to produce the first codeword are performed such that the first codeword is the same as what would have been obtained by encoding the fourth message with a recursive systematic code and generating the second message and performing the second encoding of the second message to produce the second codeword are performed such that the second codeword is the same as what would have been obtained by encoding the third message with a recursive systematic code.

In some embodiments, the first codeword and the second codeword are the same as what would have been obtained by encoding the original message with a turbo encoder.

In some embodiments, the second encoding uses a non-systematic convolution code with generator polynomials G1 and G2; the recursive systematic code has generator polynomials G1 and G2, where G1 is a feedback generator polynomial; algebraically modifying the third message to produce the second message comprises: determining the second message=Q([third message, tail sequence]/G1) where Q(y/x) defines the quotient that results from deconvolving the third message by G1, and wherein tail sequence is a sequence which drives a linear feedback shift register with feedback generator polynomial G1 to zero from an ending state when inputting the third message.

In some embodiments, determining the second message=Q ([third message, tail sequence]/G1) where Q(y/x) defines the quotient that results from deconvolving the third message by G1, and wherein tail sequence is a sequence which drives a linear feedback shift register with feedback generator polynomial G1 to zero from an ending state when inputting the third message and determining the fourth message=Q([first message, tail sequence]/G1) where Q(y/x) defines the quotient that results from deconvolving the first message by G1, and wherein tail sequence is a sequence which drives a linear feedback shift register with feedback generator polynomial G1 to zero from an ending state when inputting the first message.

In some embodiments, transmitting at least part of the first codeword and transmitting at least part of the second codeword are performed from a common location.

In some embodiments, transmitting at least part of the first codeword and transmitting at least part of the second codeword are performed from different locations.

In some embodiments, transmitting at least part of the first codeword is performed using a first network and transmitting at least part of the second codeword is performed using a second network.

In some embodiments, transmitting at least part of the first codeword is performed using a first radio access technology and transmitting at least part of the second codeword is performed using a second radio access technology operating independently from the first radio access technology.

In some embodiments, transmitting at least part of the first codeword is performed over a first carrier and transmitting at least part of the second codeword is performed over a second carrier different from the first carrier.

In some embodiments, transmitting at least part of the first codeword is performed using a first carrier and transmitting at least part of the second codeword is performed using the first carrier but at a different time from transmitting at least part of the first codeword.

In some embodiments, transmitting at least part of the first codeword is performed using a first carrier and transmitting at least part of the second codeword is performed using the first carrier concurrently with the transmission of the first codeword and using a same physical resource.

In some embodiments, transmitting the first and second codewords are performed by a single transmitter.

In some embodiments, transmitting signaling to indicate that transmitted codewords should together be treated as a turbo codeword.

Another broad aspect provides a computer readable medium having stored thereon instructions that when executed by a mobile station, cause the mobile station to implement the method of any one of the methods summarized above or detailed below.

Another broad aspect provides a computer readable medium having stored thereon instructions that when executed by a network element, cause the network element to implement any one of the methods summarized above or detailed below.

Another broad aspect provides a mobile station configured to perform any one of the methods summarized above, or detailed below.

Another broad aspect provides a network element configured to perform any one of the methods summarized above, or detailed below.

BRIEF DESCRIPTION OF THE DRAWINGS

Embodiments of the disclosure will now be described with reference to the attached drawings in which.

DETAILED DESCRIPTION

Figure 1:
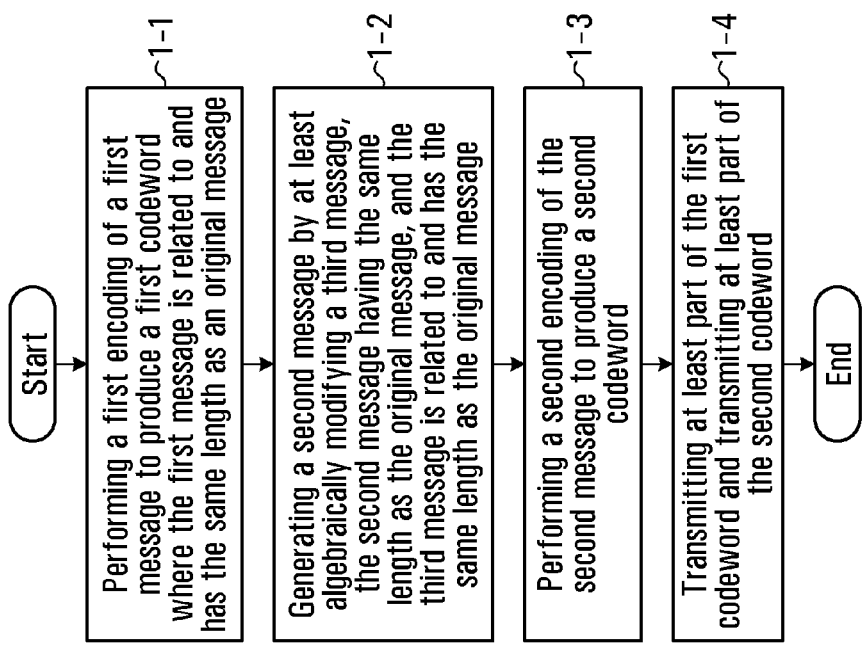
FIG. 1 is a flowchart of a method of encoding and transmitting codewords.

A method of encoding and transmitting codewords provided by an embodiment of the application is depicted in FIG. 1. The method begins in block 1-1 with performing a first encoding of a first message to produce a first codeword. The first message is related to and has the same length as an original message. In block 1-2, a second message is generated by at least algebraically modifying a third message. The second message has the same length as the original message. The third message is related to and has the same length as the original message. In block 1-3, a second encoding of the second message is performed to produce a second codeword. In block 1-4, at least part of the first codeword and at least part of the second codeword are transmitted.

The method described above includes various encoding steps. Some encoders operate upon a message with a concatenated tail sequence selected to ensure that the encoder ends up in the all zeros state. Some encoders may not require such a tail sequence. For the purpose of this description:

for encoders requiring tail sequences, the step of encoding a message to produce a codeword includes the step of concatenating a tail sequence to the message and then inputting the concatenated message to a structure that implements the remainder of the encoding operation; and for encoders that do not require tail sequences, the step of encoding a message to produce a codeword includes the step of inputting the message to a structure that implements the encoding operation.

The generation of tail sequences is well known to those skilled in the art. For example, a code with a feedback generator polynomial of degree p can be implemented using a shift register with p storage elements, and with feedback defined by the feedback generator polynomial. A p bit tail sequence concatenated to the end of the encoder input can be used to ensure the encoder ends up in the all zeros state—i.e. the shift register contains all zeros. At the input to the shift register, the feedback is combined with the tail sequence and input to the encoder. As such, after the entire message has been input to the encoder, if the feedback is a "1" (or a "0"), then a "1" (or a "0") as the first bit of the tail sequence will ensure the first storage element will contain a "0". After entering the first bit of the tail sequence, if the feedback is a "1" (or a "0"), then a "1" (or a "0") in the second tail sequence will ensure the first and second storage elements will contain zeros, and so on until all p storage elements of the shift register contain zeros.

Thus, for example, the step of encoding the first message to produce the first codeword may involve concatenating a tail sequence to the first message.

Performing algebraic modification upon a message includes any algebraic operation or combination of algebraic operations that modifies the message. Examples of algebraic operations include addition, subtraction, multiplication, division. In binary code space, multiplication is convolution, and division is deconvolution. It is noted that a simple re-ordering of the bits (i.e. interleaving) is not an example of an algebraic operation. In addition, the fact that the second message is generated by algebraically modifying the third message rules out the trivial algebraic operation of multiplication by one.

The first message is related to the original message. To name a few specific examples:

the first message may be an interleaved version of the original message;

the first message may be an algebraic modification of the original message;

the first message may be an interleaved and algebraically modified version of the original message; and the first message may be the same as the original message.

The third message is related to the original message. To name a few specific examples:

the third message may be an interleaved version of the original message;

the third message may be the same as the original message.

Figure 2:
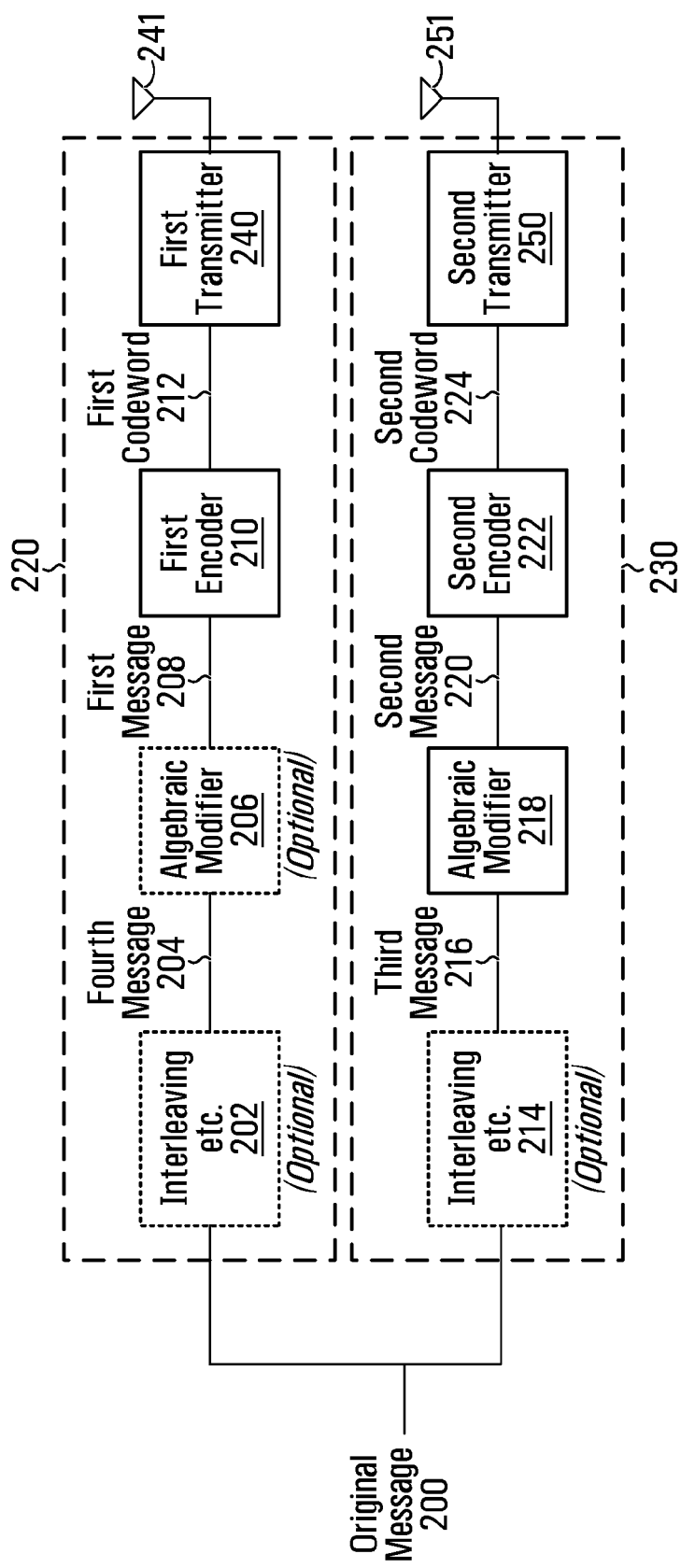
FIG. 2 is a block diagram of an encoding system for encoding and transmitting codewords.

Referring now to FIG. 2, a block diagram of an encoding system provided by an embodiment of the application will now be described. The encoding system has a first encoding path 220 that produces a first codeword 212 from an original message 200 for transmission by a first transmitter 240 having one or more antennas 241, and has a second encoding path 230 that produces a second codeword 224 from the original message 200 for transmission by a second transmitter 250 having one or more antennas 251, although in some embodiments only a single transmitter having one or more antennas is used, as detailed below. More generally, at least part of the first codeword is transmitted, and at least part of the second codeword is transmitted. For example, where the two codes emulate a turbo code, a specific example of what might be transmitted includes:

the portions of the first and second codewords that correspond to parity bits;

at least one systematic component;

the tail sequences.

This specific example will be detailed further below, but other options exist. For example, the entirety of the two codewords may be transmitted.

The first encoding path 220 has a first encoder 210 that encodes a first message 208 to produce the first codeword 212. The first message 208 is related to and has the same length as the original message 200. In the illustrated embodiment, the first encoding path 220 also has an interleaver 202 that produces a fourth message 204 from the original message 200, and has an algebraic modifier 206 that modifies the fourth message by performing an algebraic modification of the fourth message to produce the first message 208. The first message 208 is related to the original message through interleaving and algebraic modification relationship. More generally, any relationship between the first message 208 and the original message is contemplated. To name a few specific examples:

the first message 208 may be an interleaved version of the original message 200 (in which case there is no block 206);

the first message 208 may be an algebraic modification of the original message 200 in which case there is no block 202;

the first message 208 may be an interleaved version and algebraic modification of the original message 200 in which case both block 202 and 206 exist; and the first message 208 may be the same as the original message 200 in which case blocks 202,206 are not present.

The second encoding path 230 has an algebraic modifier 218 that performs an algebraic operation on a third message 216 to produce a second message 220. The third message 216 is related to the original message. The second encoding path 230 has a second encoder 222 that encodes the second message 220 to produce the second codeword 224. In the illustrated embodiment, the second encoding path 230 has an interleaver 214 that produces the third message 216 from the original message 200. The third message 216 is related to the original message through an interleaving relationship. More generally, any relationship between third message 216 and the original message is contemplated. To name another specific example, the third message 216 may be the same as the original message 200 in which case block 214 is not present.

The remaining discussion is applicable to both the method and apparatus embodiments. Discussion of the first encoder 210 applies to the first encoding block 1-1; discussion of the second encoder 222 applies to the second encoding block 1-3. Discussion of the algebraic modifier 206 also applies to the algebraic modification performed (in some embodiments) on the fourth message. Discussion of the algebraic modifier 218 also applies to the algebraic modification performed on the third message in block 1-2. Discussion of the first transmitter 240 and the second transmitter 250 applies to the transmitting block 1-4

The following discussion refers to the transmission of codewords. In some embodiments, the entire codewords are transmitted. More generally, wherever there is a reference to a transmission of a codeword, in some embodiments the transmission of the codeword in its entirety is contemplated, and in some embodiments the transmission of at least a part of the codeword is contemplated. As a specific example, the "at least a part of a codeword" may be a codeword not including a systematic component.

In the illustrated example of FIG. 2, there are two antennas, but as mentioned above, more generally there may be one or more antennas. The two codewords are collectively transmitted over the one or more antennas with the possibility that at least one of the codewords is split up and parts thereof transmitted on different antennas. In some embodiments, where there are two or more antennas, a first subset of the antennas is associated with a first radio access technology, and a second subset of the antennas is associated with a second radio access technology.

In some embodiments, the first and second codewords are constructed such that the original message at a receive node can be recovered through iterative decoding, such as turbo decoding. Further detailed examples are provided below.

In some embodiments, the first encoder 210 and the second encoder 222 are each TNC (traditional non-recursive convolutional) encoders. These encoders may implement the same or different TNC codes. A TNC code includes both systematic and non-systematic non-recursive convolutional codes.

In some embodiments, generating the second message and performing the second encoding of the second message to produce a second codeword are performed such that the second codeword is the same as what would have been obtained by encoding the third message with an RSC encoder. In a specific example, the first encoder may implement an RSC, and the second encoder implements a TNC code to produce an output that, due to the inclusion of the algebraic modification is equivalent to that of an RSC, such that the two codewords both appear to be RSC codewords at the receiver.

In some embodiments, generating the first message and performing the first encoding of the first message to produce the first codeword are performed such that the first codeword is the same as what would have been obtained by encoding the message with a RSC encoder, and generating the second message and performing the second encoding of the second message to produce the second codeword are performed such that the second codeword is the same as what would have been obtained by encoding the message with a RSC encoder. In a specific example, the first encoder may implement a TNC code to produce an output equivalent to that of an RSC, and the second encoder implements a TNC code to produce an output equivalent to that of an RSC, such that the two codewords both appear to be RSC codewords at the receiver.

In some embodiments, the first transmitter 240 and the second transmitter 250 are co-located.

In some embodiments, the first transmitter 240 and the second transmitter 250 are in different locations.

In some embodiments, the first transmitter 240 is part of a first network and the second transmitter 250 is part of a second network.

In some embodiments, the first transmitter 240 uses a first radio access technology, and the second transmitter 250 uses a second radio access technology different from the first radio access technology.

In some embodiments, in a wireless device equipped with the capability of carrier aggregation, the same RAT is used to simultaneously transmit the two codewords on multiple carriers by one transmitter or two transmitters.

In some embodiments, the first transmitter uses a first carrier, and the second transmitter a second carrier different from the first carrier.

In some embodiments, the first transmitter uses a first carrier, and the second transmitter uses the first carrier but at a different time from transmitting at least part of the first codeword.

In some embodiments, the first transmitter uses a first carrier, and the second transmitter uses the first carrier concurrently with the transmission of the first codeword and using a same physical resource.

In some embodiments there is only a single transmitter, and both the first and second codewords are transmitted from the single transmitter.

In some embodiments, the approach of transmitting two codewords is performed in a selective manner such that for some of the time, or for some traffic, the transmission of two codewords is performed, while at other times or for other traffic, only a single codeword is transmitted. In some embodiments, the two codewords are transmitted for high value packets (for example as defined by a packet value criteria); alternatively, certain packets may simply be designated high value on highly error prone channels (for example as defined by some type of quality threshold).

In some embodiments, when resources of two transmissions are available, the coding rate used for the two codewords is reduced in a manner that attains the same performance as would have been achieved with a single codeword at a higher coding rate. For example, there may be a case where any one transmission is not able to provide the full resource at the required coding rate but can do so at a lower coding rate; then by using two resources, the equivalent desired coding rate (and consequently bit error rate) may be achieved.

In some embodiments a retransmission protocol is implemented, for example a HARQ (hybrid automatic repeat request) protocol. This can involve, for example, NACK (negative acknowledgement) feedback for one or both codewords, or for the composite codeword (a composite codeword being the combination of the first codeword and the second codeword). Many variations are possible to deal with HARQ retransmission.

In some embodiments, after a mobile station performs iterative decoding based on the receipt of the codewords on the two resources, if the mobile station is able to correctly decode the codeword, then an ACK is transmitted, and/or if the mobile station is not able to correctly decode the codeword then a NACK is transmitted. In this case, the ACK and/or NACK functions to ACK/NACK the composite codeword transmission. Such an ACK/NACK could be transmitted:

in some embodiments using an ACK/NACK feedback path associated with the first transmission resource (the resource used to transmit the first codeword), in some embodiments using an ACK/NACK feedback path associated with the second first transmission resource (the resource used to transmit the second codeword), in some embodiments using ACK/NACK feedback paths associated with the first and second transmission resources.

In response to a NACK (or absence of an ACK in an ACK-only scheme):

in some embodiments, the entire composite codeword may be transmitted or parts thereof;

in some embodiments, only the first codeword is retransmitted or a part thereof;

in some embodiments, only the second codeword is retransmitted or a part thereof.

In some embodiments, initially, only the first codeword is transmitted. The mobile station sends an ACK and/or NACK in respect of such transmission as a function of whether the mobile station could correctly decode the first codeword. If the transmitter concludes the transmission was unsuccessful, then the second codeword is transmitted, and then an iterative decoding process is performed at the receiver based on the first and second codewords.

Figure 3A:
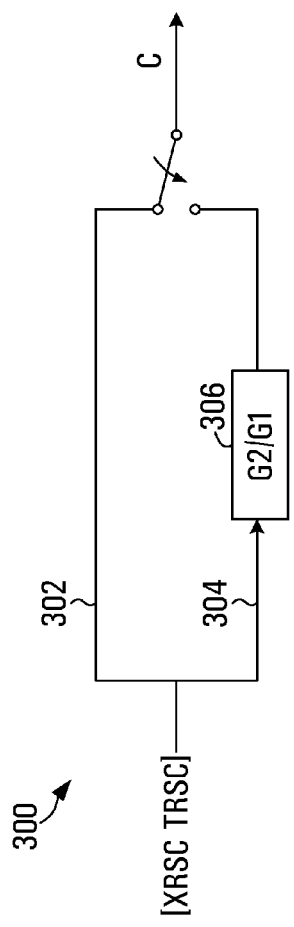
FIG. 3A is a schematic diagram of an RSC encoder.

FIG. 3A depicts an RSC encoder generally indicated 300, that implements an RSC code. The input to the RSC encoder 300 is XRSC and tail sequence TRSC. The top path 302 produces a systematic component XRSC and the tail sequence TRSC, and the bottom path 304 produces a parity stream using generator polynomials G2/G1 306, where G1 is fed back to the input. The codeword c produced by the RSC encoder 300 is a combination of the systematic output, the tail sequence and the parity stream.

Figure 3B:
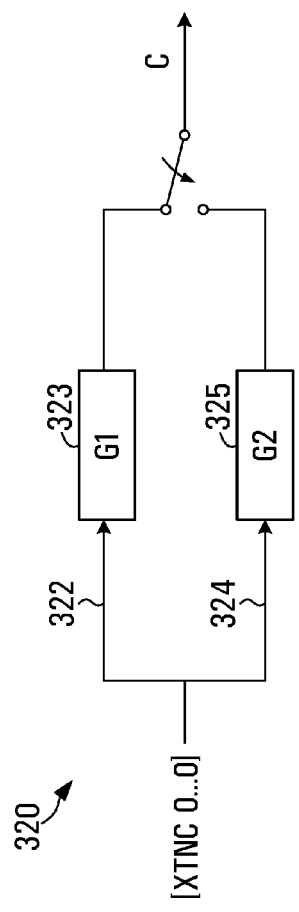
FIG. 3B is a schematic diagram of a TNC encoder.

FIG. 3B depicts a TNC encoder generally indicated 320 that implements a TNC code. The TNC encoder 320 has the same generator polynomials G1,G2 as does the RSC encoder 300. The input to the TNC encoder 320 is XTNC and a tail sequence of zeros. The top path 322 produces a first stream by encoding with generator polynomial G1 323, and the bottom path 324 produces a second stream by encoding with generator polynomial G2 325. The codeword c produced by the TNC encoder 320 is a combination of the first stream and the second stream.

Figure 4:
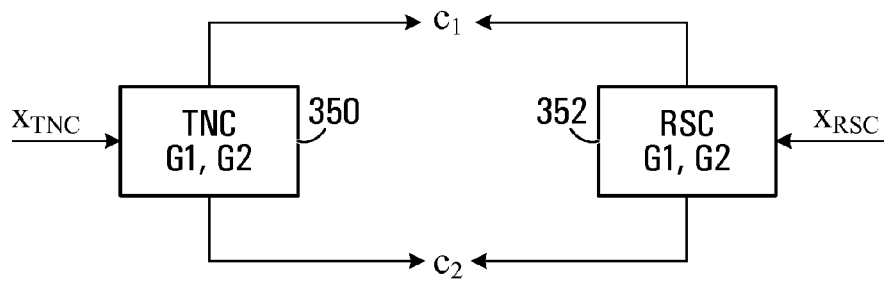
FIG. 4 depicts the equivalence in the code space of a traditional non-recursive convolutional code and a recursive systematic code.

The codespace for RSC codes and TNC codes with the same generator polynomials is identically the same. This equivalence is depicted in FIG. 4. With a suitably modified input XTNC to a TNC encoder 350 with generator polynomials G1 and G2, the TNC encoder 350 can be made to output the same codewords as would be the case where XRSC input to an RSC encoder 352 with the same generator polynomials G1 and G2. With reference again to FIGS. 3A and 3B, TNC encoder 320 is the related version of RSC encoder 300 that produces identical codewords.

Equivalence Between Recursive Systematic Convolutional Codes (RSC) and Traditional Convolutional Codes (TNC).

Consider a RSC with generator polynomials G1 and G2 and such that G2 is used to produce the parity stream, and G1 is fed back to the input. There exists a TNC code with the same generator polynomials G1,G2 which is equivalent to the RSC code in the following sense: if the RSC encoder maps the input XRSC encoder to codeword c, then there exists an input XTNC to the TNC which is mapped to the same codeword c.

A relation exists between the inputs XRSC and XTNC. As detailed previously, in order to guarantee both the TNC encoder and RSC encoder end up in the all-zero state, XRSC and XTNC are suffixed with tail sequences TRSC and TTNC, with TTBC being the all-zero sequence. For a known RSC input XRSC and the feedback generator polynomial G1, the TNC input XTNC can be computed as follows.

To begin, the following relationship exists between XRSC, TRSC, XTNC and G1:

$$XRSC + TRSC = XTNC * G1$$

For simplicity let:
1) A (traditional) non-recursive convolutional encoder and a recursive systematic convolutional encoder have the same generator polynomials G1 and G2 of length L;
2) XRSC and XTNC are messages of length N;
3) XTNC is a message that when input to the traditional convolutional encoder produces the codeword c; and
4) XRSC is the message that when input to the recursive systematic convolutional encoder produces the same codeword c.

Generating XRSC from XTNC:
Step 1: Convolve XTNC with the generator G1 to produce a sequence P1 of length N+L−1.
Step 2: XRSC is then the first N bits of the sequence P1.

Generating XTNC from XRSC:
Step 1: Produce TRSC the sequence which drives the linear feedback shift register with feedback generator polynomial G1 to zero from the ending state when inputting the message XRSC (This is the RSC tail sequence discussed previously, and can be determined as described previously in the discussion of tail sequences).
Step 2: Form the vector [XRSC TRSC].
Step 3: XTNC is the quotient in the deconvolution of [XRSC TRSC] by G1.

To terminate the recursive convolutional code, a tail sequence of length L (L is the degree of G1), TRSC, is appended to XRSC to drive the ending state to state 0. Therefore, [XRSC TRSC] is a length N+L sequence (as it is assumed that the length of XRSC is N). To terminate the non-recursive convolutional code, L zeros are required to append the input message XTNC.

In summary, to generate the same codeword c, the input message of recursive convolutional code XRSC and the input message of non-recursive convolutional code XTNC should be related as: XTNC=Q([XRSC TRSC]/G1) where Q(y/x) defines the quotient of y/x, which is another form of the equation above.

Figure 3C:
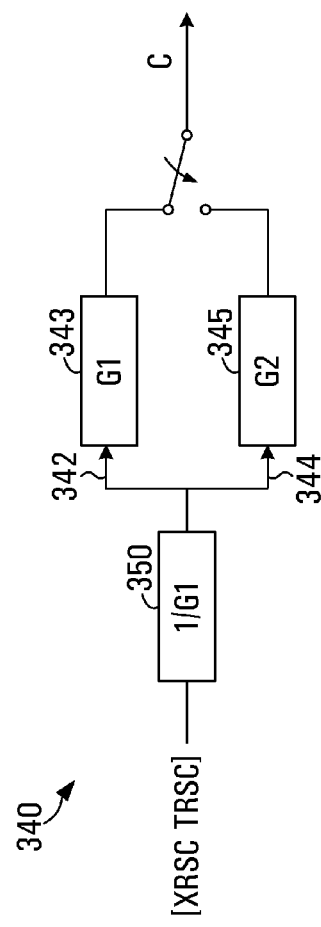
FIG. 3C is a schematic diagram of a TNC encoder with a modified input such that the output is equivalent to that of an RSC encoder.

This is depicted in FIG. 3C, where a TNC encoder generally indicated 340 is depicted that implements a TNC code. The TNC encoder 340 has the same generator polynomials G1,G2 as does the RSC encoder 300. Also shown is a deconvolver 350. The input to the deconvolver is [XRSC,TRSC]. The quotient of the deconvolution operation is Q[XRSC, TRSC]/G1. To this is concatenated the all zeros tail sequence, and the input to the remainder of the encoder is [Q(XRSC, TRSC]/G1) 0, . . . , 0] The top path 342 produces a first stream by encoding with generator polynomial G1 343, and the bottom path 344 produces a second stream by encoding with generator polynomial G2 345. The codeword c produced by the TNC encoder 340 is a combination of the first stream and the second stream and is the same as that output by the RSC encode 300 of FIG. 3A.

Turbo Coding with Traditional Non-Recursive Convolutional Codes.

Figure 5:
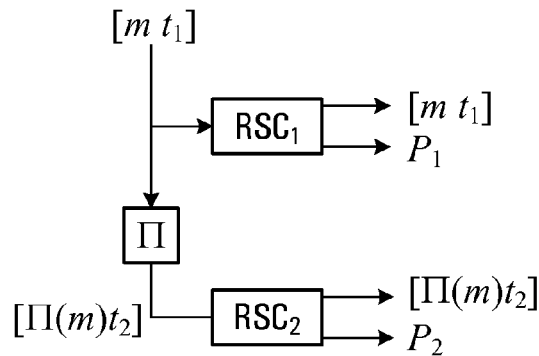
FIG. 5 is a block diagram of a turbo encoder.

Consider the rate ⅓ turbo encoder in FIG. 5. The recursive systematic convolutional codes $RSC_1$ and $RSC_2$ have generator polynomials G2/G1 and G4/G3 respectively, with G1 fed back to the input in $RSC_1$ and G3 fed back to the input in $RSC_2$. The message m is followed by a tail sequence $t_1$ in order to ensure that $RSC_1$ terminates in the all-zero state. The message is interleaved to produce interleaved message Π(m). A tail sequence $t_2$, is appended to the output Π(m) of the interleaver in order to ensure that $RSC_2$ ends up in the all-zero state. The output of $RSC_1$ is the systematic output m, tail sequence $t_1$ and parity bits $P_1$. Similarly, the output of $RSC_2$ is the systematic output Π(m), tail sequence $t_2$ and parity bits $P_2$. In many turbo encoder implementations, only one of the two systematic outputs (i.e. either m or Π(m)) is transmitted, along with the tail sequences $t_1$, $t_2$ and the two parity streams $P_1$, $P_2$.

Figure 6:
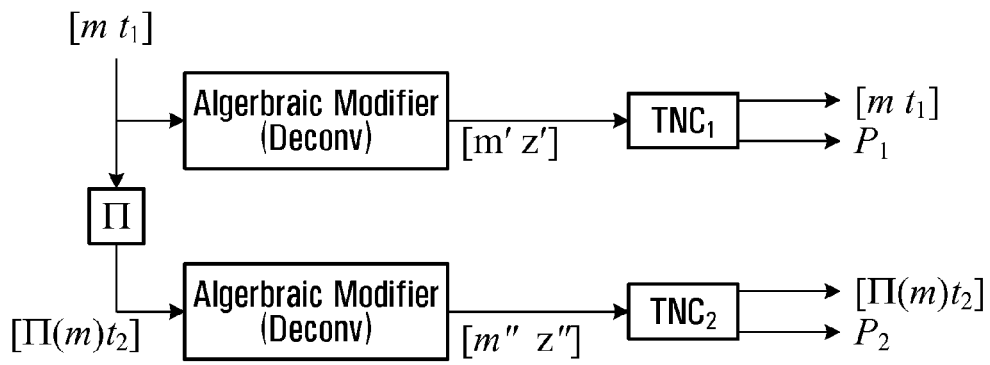
FIG. 6 is a block diagram of an encoder that uses traditional non-recursive convolutional encoders to generate codewords that are equivalent to those generated by the turbo encoder of FIG. 5.

Consider now the rate ⅓ encoder in FIG. 6, in which $RSC_1$ and $RSC_2$ of FIG. 5 have been replaced by their TNC equivalents $TNC_1$ and $TNC_2$. The message with concatenated tail sequence [m $t_1$] is deconvolved with respect to G1 and the quotient of the deconvolution, which is of the form [m' z'] where z' is a tail of zeros, is input to $TNC_1$. Likewise, the output from the interleaver Π(m) with concatenated tail sequence $t_2$ is deconvolved with respect to G3, and the quotient [m" z"], where z" is a tail of zeros, is input to $TNC_2$. The tails z' and z" ensure that the shift registers in $TNC_1$ and $TNC_2$ terminate in the all-zero state. The output of the arrangement of FIG. 6 is identical to the output generated by the original turbo code in FIG. 5. More specifically, the output of $TNC_1$ is the systematic output m, tail sequence $t_1$ and parity bits $P_1$. Similarly, the output of $TNC_2$ is the systematic output Π(m), tail sequence $t_2$ and parity bits $P_2$. As is the case for a conventional turbo encoder, optionally only one of the two systematic outputs (i.e. either m or Π(m)) need be transmitted, along with the tail sequences $t_1$, $t_2$ and the two parity streams $P_1$, $P_2$.

It is therefore possible to generate two modified messages m' and m" from a given message m such that when m' and m" are input to two TNCs, the combined outputs can be treated as a turbo codeword corresponding to the original message m.

If used in a system in which conventional TNC encoding is expected, the following steps can be taken to result in the equivalent of a Turbo coding setup:
1. Encoding: modification of the original message into two separate messages,
2. Signaling: conveying to the decoder that the encoded stream is to be treated as a turbo codeword, and
3. Decoding: using a turbo decoder to decode the encoded stream which combines the code bits of the two separate messages.

Any turbo encoder interleaver and decoder designs may be employed.

Two specific examples of the turbo encoder interleaver and turbo decoder designs include:
  HSPA (High Speed Packet Access) turbo interleaver: Advantage: information block length can be any integer (within a certain min and max length). Disadvantage: does not facilitate parallel processing in the turbo decoder.
  LTE turbo decoder: Advantage: built in parallel processing; Disadvantage: may need to pad the message block to fit the discrete sizes.

Multi-RAT Transmission

As indicated previously, in some embodiments, the first codeword is sent using a first RAT, and the second codeword is sent using a second RAT. For such embodiments, a wireless device equipped with the capability to operate on multiple carriers is assumed, either supporting multiple RAT configurations or carrier aggregation. In the case of multiple RATs, each of the RATs may operate on a different carrier frequency, in which case RAT diversity also corresponds to carrier diversity.

Inter-RAT Exchange Function

Figure 7:
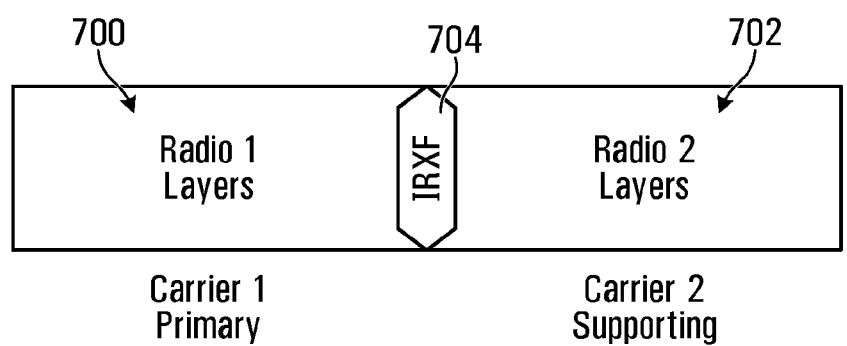
FIG. 7 is a logical block diagram showing an inter-RAT exchange function between radio 1 layers and radio 2 layers.

FIG. 7 depicts a block diagram of a system that includes Radio 1 layers 700 (of a first radio access technology) and Radio 2 layers 702 (of a second radio access technology. An inter-RAT eXchange Function (IRXF) 704 is also depicted. The purpose of IRXF 704 is to enable cooperation between the respective layers of the different RATs; for example, to facilitate the exchange of physical layer redundant coded bits between the co-operating RATs to allow inter-RAT transfer of redundant bits without a need to modify the standardized protocol stacks of the co-operating RATs. Thus inter-RAT error control coding and decoding can be done.

Synchronization between carriers' physical layers, coordinated by the IRXF 704, may be performed. However, in some cases the IRXF includes transmit and receive buffers where the transmit data and the received data may be temporarily stored for further processing in which case synchronization is not necessary.

The transmission of redundant bits is a form of incremental redundancy with carrier diversity rather than with time diversity. Compared to incremental redundancy with time diversity, the delay is minimized since the transmission occurs simultaneously on a different RAT or carrier frequency and the transmission on an alternate carrier may reduce the impact of frequency selective fading or shadowing.

The multi-RAT transmission diversity of redundant bits may lead to better performance than transmission diversity of redundant bits with time diversity on the same carrier.

Inter-RAT Forward Error Correction

Figure 8:
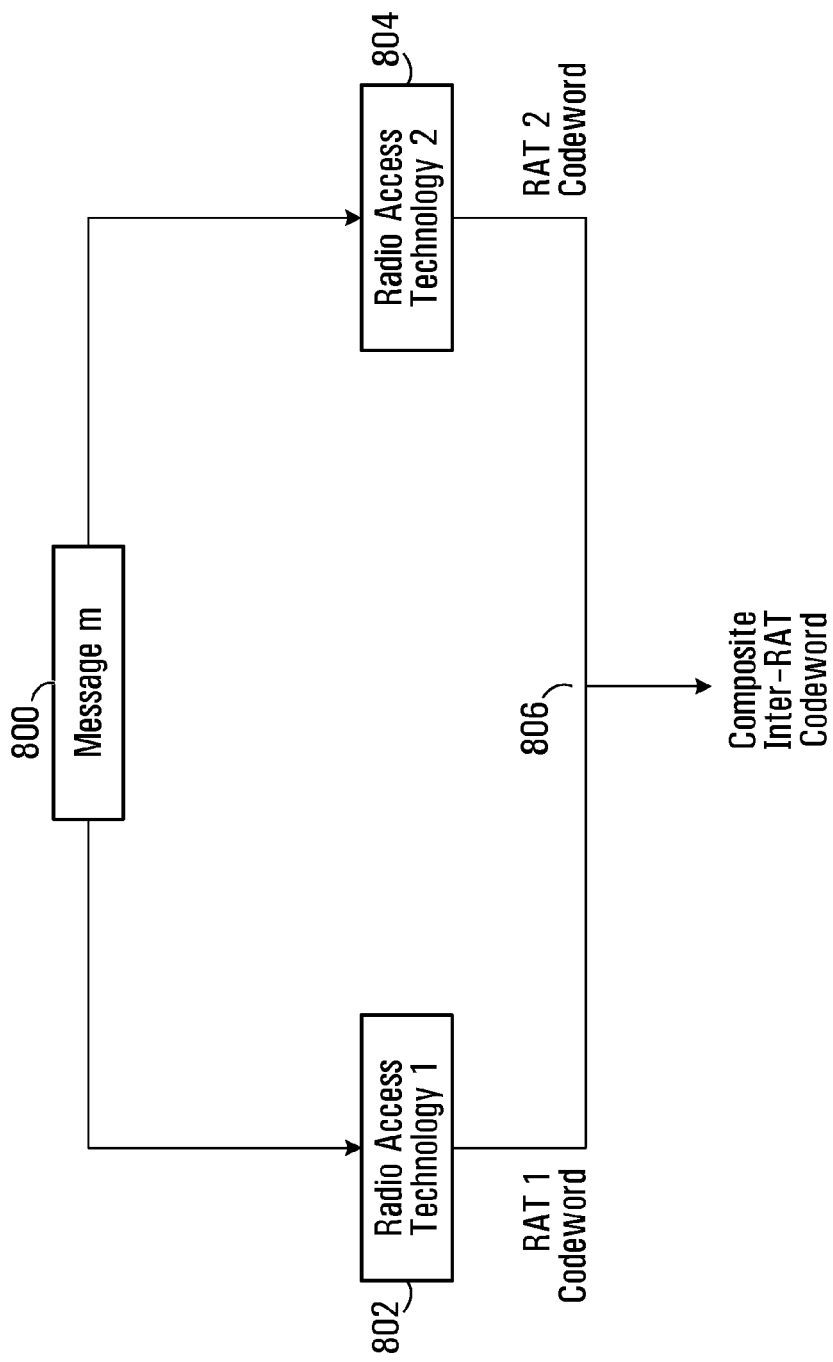
FIG. 8 is a block diagram of a system employing inter-RAT transmission diversity.

The use of multiple carriers provides an opportunity to exploit carrier diversity by performing some form of inter-RAT error control coding as illustrated in FIG. 8. In FIG. 8, a RAT 1 codeword produced from message m 800 is transmitted using the first RAT 802, and a RAT 2 codeword produced from the message m is transmitted using the second RAT 804. The two codewords together form a composite inter-RAT codeword.

Figure 9:
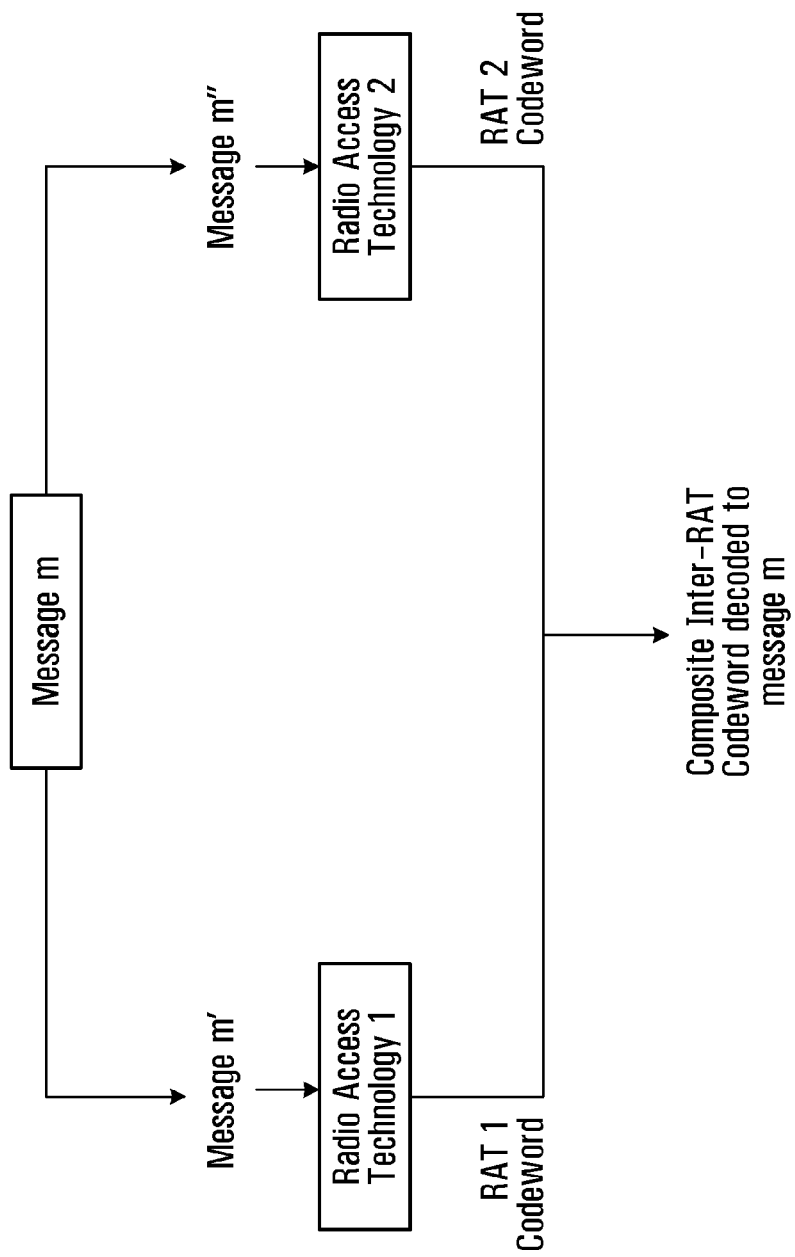
FIG. 9 is a block diagram of a system employing inter-RAT transmission diversity and inter-RAT forward error correction.

Instead of directly encoding the original message, different but related messages are encoded over the separate RATs producing different codewords on each RAT, as shown in FIG. 9. Specific examples of how the original message m may be modified have been provided previously, and apply here. Such an approach may be useful in a variety of applications, e.g., medical type wireless applications, where robust communications can be of critical importance. FIG. 9 is similar to FIG. 8 but shows the production of different but related messages m' and m" from message m.

Figure 10:
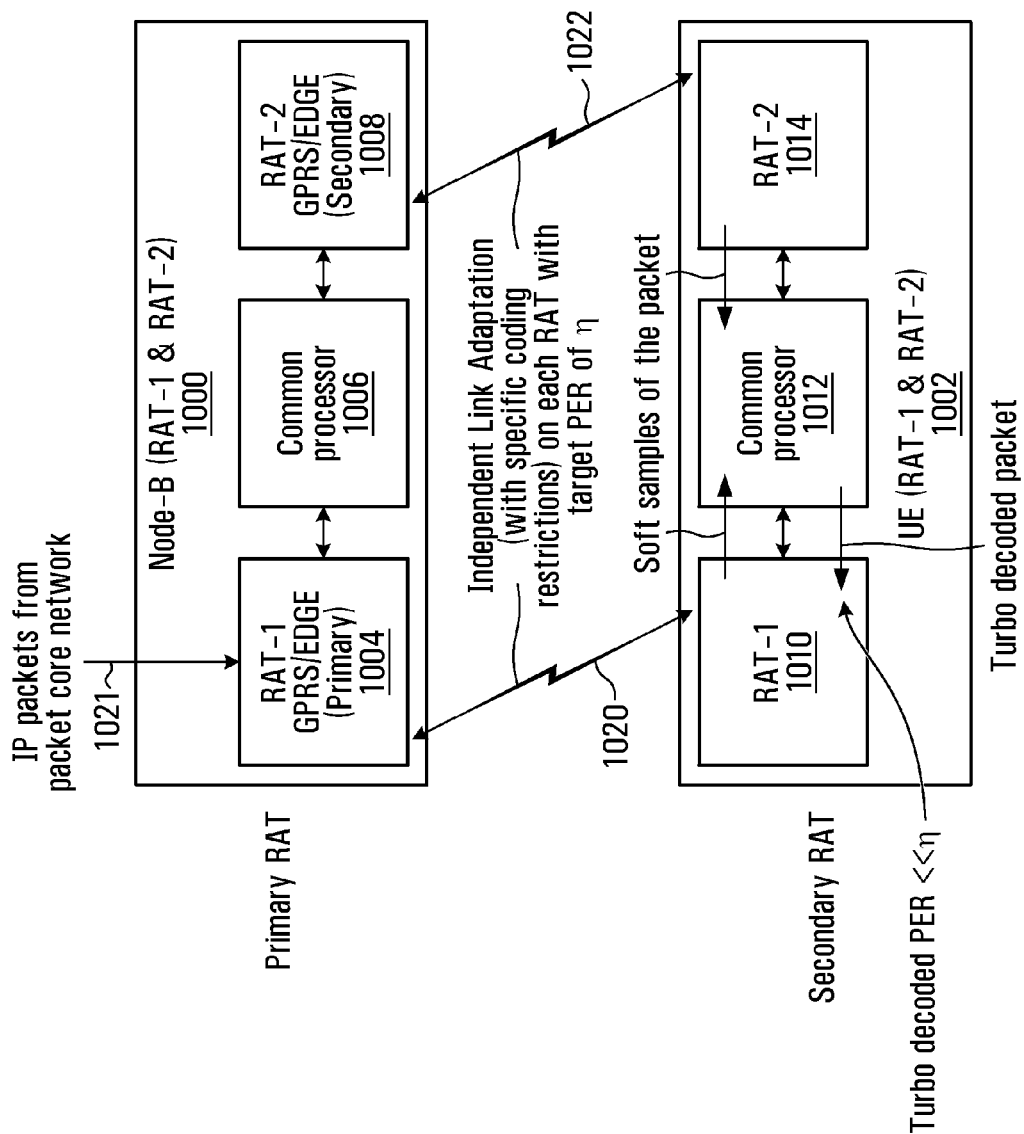
FIG. 10 is a block diagram of a system framework for enabling inter-carrier error control coding.

A system framework for enabling inter-carrier error control coding will now be described with reference to FIG. 10. Transmit side functionality is generally indicated at 1000 while receive functionality is generally indicated at 1002. The transmit functionality includes RAT-1 transmitter 1004 which in the illustrated example is one of GPRS,EDGE, UMTS, and LTE but other RATs may be used instead. There is a RAT-2 transmitter 1008 which in the illustrated example is also one of GPRS,EDGE,UMTS,LTE, but other RATs may be used instead. RAT-1 may be different from RAT-2. RAT-1 is referred to as the primary RAT, and RAT-2 is referred to as the secondary RAT. A common processor 1006 is depicted. It is common in the sense that it participates in providing at least part of both RAT-1 and RAT-2 functionality. The common processor 1006 coordinates transmissions from RAT-1 and RAT-2, for example via an IRXF interface 704 such as depicted in FIG. 7. Here it is assumed that IP packets for transmission are received from the packet core network at 1021 by the primary RAT, i.e., RAT-1.

The receive functionality 1002 includes RAT-1 receiver 1010 and RAT-2 receiver 1014. A common processor 1012 is depicted. Communications between RAT-1 transmitter 1004 and RAT-1 receiver 1010 occur over a first wireless link 1020 and communications between RAT-2 transmitter 1008 and RAT-2 receiver 1014 occur over a second wireless link 1022. Independent link adaptation may be performed over the two links 1020,1022, in some cases with specific coding restrictions such that the inter-RAT codeword has the desired characteristics. In some cases, the link adaptation for the two links is done to achieve the same target PER (packet error rate), $\eta$, which is defined by the higher layers.

The common processors 1006,1012 may include transmit and receive buffers respectively as well as the algorithm enhancements for the coding and decoding algorithms. An example of a procedure for enabling transfer of bits between the respective physical layers of two different carriers is described in PCT International application no. PCT/CA2011/050476 filed Aug. 4, 2011, entitled Methods to enable efficient use of multiple radio access technologies" hereby incorporated by reference in its entirety.

The transmit functionality 1000 performs some pre-processing of the data prior to application of the conventional coding procedure for the given RAT. At the receive end, the data is decoded differently if inter-RAT error control coding is employed. On the transmit side, the IP packets 1021 are segmented into MAC packets, and these are transmitted to the mobile station over the primary RAT (RAT-1 transmitter 1004) in FIG. 10. The MAC packets are also transmitted over the secondary RAT, (RAT-2 transmitter 1008), to the same receiver.

The MAC packets are received by RAT-1 receiver 1010 and RAT-2 receiver 1014 which generate respective soft information. The received MAC packets with corresponding soft information are sent to the common processor 1012 where turbo decoding is performed. The decoded packets are forwarded to the primary RAT 1010 and are subsequently passed on to the higher layers, e.g., SNDCP layer. The residual MAC packet error rate after turbo decoding may be less than $\eta$.

In some embodiments, in determining the target PER, $\eta$, the segmentation and the required residual application packet error rate are considered and this determination is performed by higher layers that have knowledge of the type application and the corresponding Quality of Service (QoS) Class Identifier (QCI). In some embodiments, the extra packet delay caused by the turbo decoder is taken into account while scheduling these packets. In some embodiments, the MAC packets received from the common processor 1006 are scheduled independently by the two RATs, RAT-1 and RAT-2. Thus the packet delay incurred depends on the scheduling delay introduced at the two RAT transmitters. When the application is delay sensitive, the common processor may indicate a time before which the packet/packets are to be transmitted by the respective RATs. This will ensure the end-to-end packet delay requirement is satisfied.

Simulations

Figure 11:
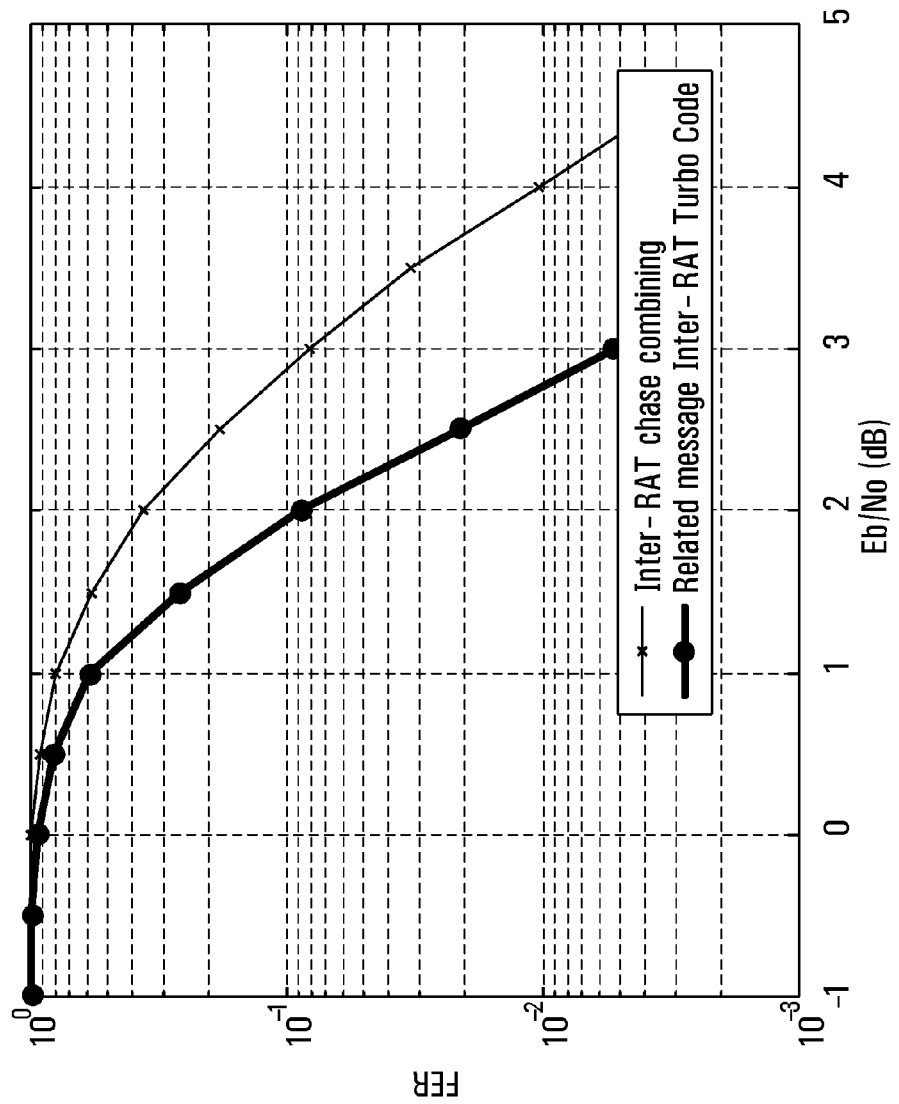
FIG. 11 is a plot of example performance results.

An example of benefits which may be achieved with related message inter-RAT coding is investigated with simulation and the results are shown in FIG. 11. Simulations assume both available RATs support GSM/EDGE and use the GPRS CS1 channel. Accordingly a message size of 224 bits is convolutionally encoded at each RAT and transmitted over an AWGN (additive white Gaussian noise) channel. In the case of Inter-RAT chase combining, the same codeword is formed at each RAT, however in the case of Related Message Inter-RAT Turbo Code, the message presented to each convolutional encoder is modified such that the transmitted data forms a complete Turbo codeword.

As shown, the Related Messages Inter-RAT Turbo Code approach provides over 1 dB in performance gain at a 1% FER level in the AWGN channel.

Two Parallel Transmissions from Two RATs.

As indicated above, in some embodiments, the two codewords are transmitted in parallel from two different RATs.

In some such embodiments, the two RATs (e.g., GSM, HSPA) are co-located. Each transmission uses a convolutional code (TNC), and the two transmissions are generated such that they can be combined to form a turbo codeword. An advantage of this scheme is that there is no delay between the two RSC codewords.

Transmit the Two Codewords from the Same RAT

As indicated previously, in some embodiments, the two codewords are transmitted from the same RAT. The first codeword may be formulated such that it is equivalent to the codeword of the first RSC. The second codeword may be formulated such that it is equivalent to the codeword of the second RSC. Thus the two codewords can be combined to form a turbo codeword.

In some embodiments, this can be used as a modification of HARQ in that the first codeword is used as an initial transmission, and the second RSC codeword is used as the retransmission when necessary, instead of Chase combining or incremental redundancy transmission.

If the turbo codeword fails (after the $2^{nd}$ transmission), the third transmission can repeat the first RSC codeword. If the $3^{rd}$ transmission still does not result in a successful reception, the fourth transmission can repeat the second RSC codeword.

Advantageously, with this approach only one RAT is needed, and the radio resources for additional redundancy ($2^{nd}$ transmission, $3^{rd}$ transmission, etc.) are used only when deemed necessary via the HARQ response.

While all of the embodiments have assumed downlink transmission, similar approaches can be performed over the uplink.

Another Mobile Station

Figure 12:
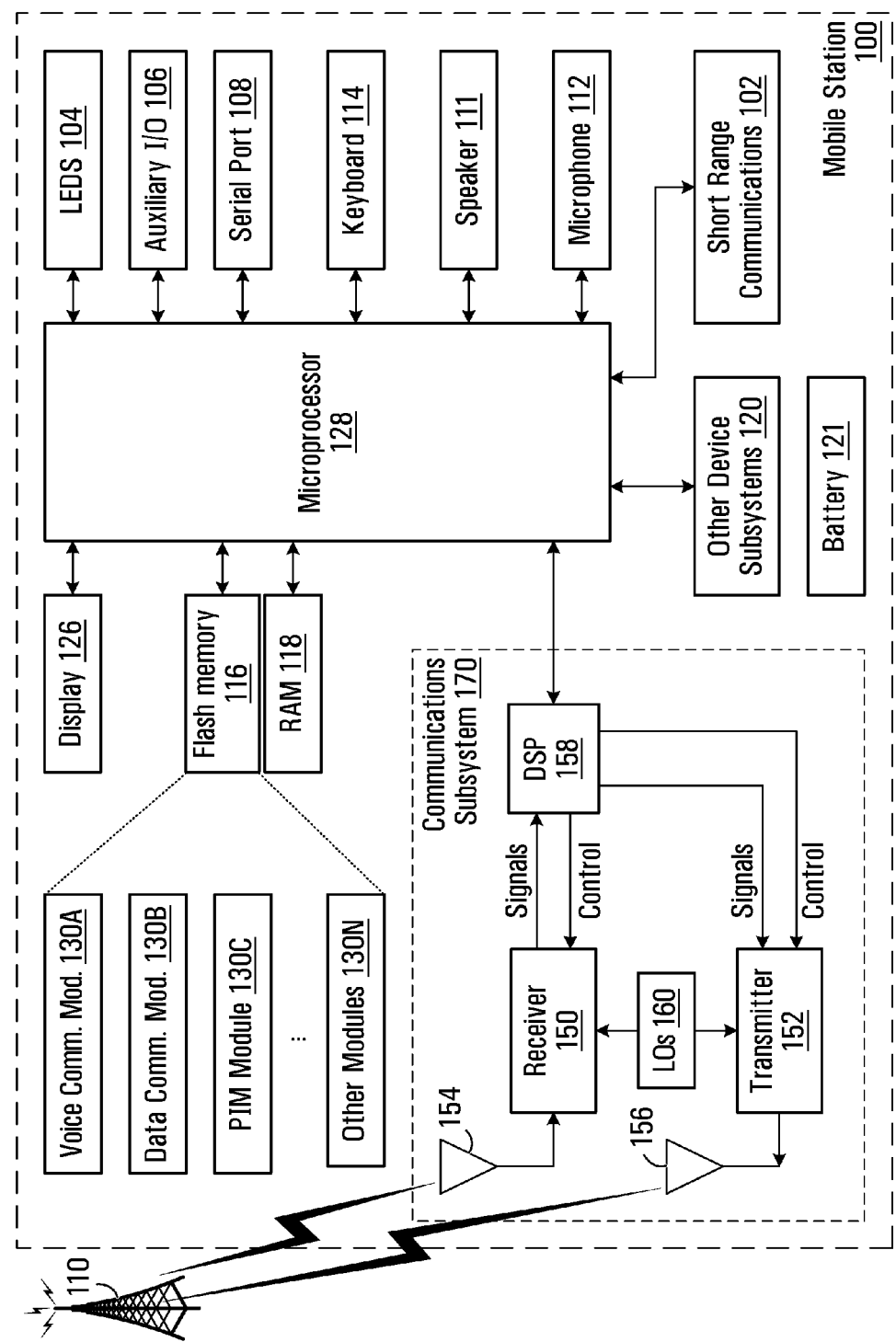
FIG. 12 is a schematic block diagram of another mobile station.

Referring now to FIG. 12, shown is a block diagram of another mobile station 100 that may implement any of the device encoding and transmitting methods and/or receiving and decoding methods described in this disclosure. In some embodiments, the wireless device 100 may include specific components for implementing features similar to those of the receive functionality 1002 of FIG. 10, where the methods are implemented on the downlink, or for implementing features similar to those of the transmit functionality of 1000, where the methods are implemented on the uplink, or both. It is to be understood that the wireless device 100 is shown with very specific details for exemplary purposes only. In a specific example, the features are implemented in a DSP such as DSP 158.

A processing device (a microprocessor 128) is shown schematically as coupled between a keyboard 114 and a display 126. The microprocessor 128 controls operation of the display 126, as well as overall operation of the wireless device 100, in response to actuation of keys on the keyboard 114 by a user.

The wireless device 100 has a housing that may be elongated vertically, or may take on other sizes and shapes (including clamshell housing structures). The keyboard 114 may include a mode selection key, or other hardware or software for switching between text entry and telephony entry.

In addition to the microprocessor 128, other parts of the wireless device 100 are shown schematically. These include: a communications subsystem 170; a short-range communications subsystem 102; the keyboard 114 and the display 126, along with other input/output devices including a set of LEDs 104, a set of auxiliary I/O devices 106, a serial port 108, a speaker 111 and a microphone 112; as well as memory devices including a flash memory 116 and a Random Access Memory (RAM) 118; and various other device subsystems 120. The wireless device 100 may have a battery 121 to power the active elements of the wireless device 100. The wireless device 100 is in some embodiments a two-way radio frequency (RF) communication device having voice and data communication capabilities. In addition, the wireless device 100 in some embodiments has the capability to communicate with other computer systems via the Internet.

Operating system software executed by the microprocessor 128 is in some embodiments stored in a persistent store, such as the flash memory 116, but may be stored in other types of memory devices, such as a read only memory (ROM) or similar storage element. In addition, system software, specific device applications, or parts thereof, may be temporarily loaded into a volatile store, such as the RAM 118. Communication signals received by the wireless device 100 may also be stored to the RAM 118.

The microprocessor 128, in addition to its operating system functions, enables execution of software applications on the wireless device 100. A predetermined set of software applications that control basic device operations, such as a voice communications module 130A and a data communications module 130B, may be installed on the wireless device 100 during manufacture. In addition, a personal information manager (PIM) application module 130C may also be installed on the wireless device 100 during manufacture. The PIM application is in some embodiments capable of organizing and managing data items, such as e-mail, calendar events, voice mails, appointments, and task items. The PIM application is also in some embodiments capable of sending and receiving data items via a wireless network 110. In some embodiments, the data items managed by the PIM application are seamlessly integrated, synchronized and updated via the wireless network 110 with the device user's corresponding data items stored or associated with a host computer system. As well, additional software modules, illustrated as another software module 130N, may be installed during manufacture.

Communication functions, including data and voice communications, are performed through the communication subsystem 170, and possibly through the short-range communications subsystem 102. The communication subsystem 170 includes a receiver 150, a transmitter 152 and one or more antennas, illustrated as a receive antenna 154 and a transmit antenna 156. In addition, the communication subsystem 170 also includes a processing module, such as a digital signal processor (DSP) 158, and local oscillators (LOs) 160. The specific design and implementation of the communication subsystem 170 is dependent upon the communication network in which the wireless device 100 is intended to operate. For example, the communication subsystem 170 of the wireless device 100 may be designed to operate with the Mobitex™, DataTAC™ or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access (CDMA), Personal Communications Service (PCS), Global System for Mobile Communications (GSM), etc. Examples of CDMA include 1X and 1x EV-DO. The communication subsystem 170 may also be designed to operate with an 802.11 Wi-Fi network, and/or an 802.16 WiMAX network. Other types of data and voice networks, both separate and integrated, may also be utilized with the wireless device 100.

Network access may vary depending upon the type of communication system. For example, in the Mobitex™ and DataTAC™ networks, wireless devices are registered on the network using a unique Personal Identification Number (PIN) associated with each device. In GPRS networks, however, network access is typically associated with a subscriber or user of a device. A GPRS device therefore typically has a subscriber identity module, commonly referred to as a Subscriber Identity Module (SIM) card, in order to operate on a GPRS network.

When network registration or activation procedures have been completed, the wireless device 100 may send and receive communication signals over the communication network 110. Signals received from the communication network 110 by the receive antenna 154 are routed to the receiver 150, which provides for signal amplification, frequency down conversion, filtering, channel selection, etc., and may also provide analog to digital conversion. Analog-to-digital conversion of the received signal allows the DSP 158 to perform more complex communication functions, such as demodulation and decoding. In a similar manner, signals to be transmitted to the network 110 are processed (e.g., modulated and encoded) by the DSP 158 and are then provided to the transmitter 152 for digital to analog conversion, frequency up conversion, filtering, amplification and transmission to the communication network 110 (or networks) via the transmit antenna 156.

In addition to processing communication signals, the DSP 158 provides for control of the receiver 150 and the transmitter 152. For example, gains applied to communication signals in the receiver 150 and the transmitter 152 may be adaptively controlled through automatic gain control algorithms implemented in the DSP 158.

In a data communication mode, a received signal, such as a text message or web page download, is processed by the communication subsystem 170 and is input to the microprocessor 128. The received signal is then further processed by the microprocessor 128 for an output to the display 126, or alternatively to some other auxiliary I/O devices 106. A device user may also compose data items, such as e-mail messages, using the keyboard 114 and/or some other auxiliary I/O device 106, such as a touchpad, a rocker switch, a thumb-wheel, or some other type of input device. The composed data items may then be transmitted over the communication network 110 via the communication subsystem 170.

In a voice communication mode, overall operation of the device is substantially similar to the data communication mode, except that received signals are output to a speaker 111, and signals for transmission are generated by a microphone 112. Alternative voice or audio I/O subsystems, such as a voice message recording subsystem, may also be implemented on the wireless device 100. In addition, the display 126 may also be utilized in voice communication mode, for example, to display the identity of a calling party, the duration of a voice call, or other voice call related information.

The short-range communications subsystem 102 enables communication between the wireless device 100 and other proximate systems or devices, which need not necessarily be similar devices. For example, the short range communications subsystem may include an infrared device and associated circuits and components, or a Bluetooth™ communication module to provide for communication with similarly-enabled systems and devices.

Numerous modifications and variations of the present disclosure are possible in light of the above teachings. It is therefore to be understood that within the scope of the appended claims, the disclosure may be practiced otherwise than as specifically described herein.

We claim:

1. A method comprising:
performing a first encoding of a first message to produce a first codeword where the first message is related to and has the same length as an original message;
generating a second message by at least algebraically modifying a third message, the second message having the same length as the original message, and the third message is related to and has the same length as the original message;
performing a second encoding of the second message to produce a second codeword; and
transmitting at least part of the first codeword and transmitting at least part of the second codeword;
wherein transmitting at least part of the first codeword and transmitting at least part of the second codeword are performed from different locations.

2. The method of claim 1 wherein the third message is the original message.

3. The method of claim 1 wherein:
generating the second message comprises interleaving the original message to produce the third message.

4. The method of claim 1 wherein:
performing a first encoding comprises using a non-recursive convolutional encoder; and
performing a second encoding comprises using a non-recursive convolutional encoder.

5. The method of claim 1 wherein:
generating the second message and performing the second encoding of the second message to produce a second codeword are performed such that the second codeword is the same as what would have been obtained by encoding the third message with a recursive systematic code.

6. The method of claim 5 wherein:
the second encoding uses a non-systematic convolution code with generator polynomials G1 and G2;
the recursive systematic code has generator polynomials G1 and G2, where G1 is a feedback generator polynomial; and
algebraically modifying the third message to produce the second message comprises:
determining the second message=Q([third message, tail sequence]/G1) where Q(y/x) defines the quotient that results from deconvolving the third message by G1, and wherein tail sequence is a sequence which drives a linear feedback shift register with feedback generator polynomial G1 to zero from an ending state when inputting the third message.

7. The method of claim 1 further comprising:
generating the first message by at least performing algebraically modifying a fourth message, wherein the fourth message has the same length as the original message.

8. The method of claim 7 wherein the fourth message is the original message.

9. The method of claim 7 wherein:
generating the first message comprises interleaving the original message to produce the fourth message.

10. The method of claim 7 wherein:
generating the first message and performing the first encoding of the first message to produce the first codeword are performed such that the first codeword is the same as what would have been obtained by encoding the fourth message with a recursive systematic code; and
generating the second message and performing the second encoding of the second message to produce the second codeword are performed such that the second codeword is the same as what would have been obtained by encoding the third message with a recursive systematic code.

11. The method of claim 10 wherein:
the first codeword and the second codeword are the same as what would have been obtained by encoding the original message with a turbo encoder.

12. The method of claim 10 wherein:
determining the second message=Q([third message, tail sequence]/G1) where Q(y/x) defines the quotient that results from deconvolving the third message by G1, and wherein tail sequence is a sequence which drives a linear feedback shift register with feedback generator polynomial G1 to zero from an ending state when inputting the third message; and
determining the fourth message=Q([first message, tail sequence]/G1) where Q(y/x) defines the quotient that results from deconvolving the first message by G1, and wherein tail sequence is a sequence which drives a linear feedback shift register with feedback generator polynomial G1 to zero from an ending state when inputting the first message.

13. The method of claim 1 wherein transmitting at least part of the first codeword and transmitting at least part of the second codeword are performed from a common location.

14. The method of claim 1 wherein:
transmitting at least part of the first codeword is performed using a first network; and
transmitting at least part of the second codeword is performed using a second network.

15. The method of claim 1 wherein:
transmitting at least part of the first codeword is performed using a first radio access technology; and
transmitting at least part of the second codeword is performed using a second radio access technology operating independently from the first radio access technology.

16. The method of claim 1 wherein:
transmitting at least part of the first codeword is performed over a first carrier; and
transmitting at least part of the second codeword is performed over a second carrier different from the first carrier.

17. The method of claim 1 wherein:
transmitting at least part of the first codeword is performed using a first carrier; and
transmitting at least part of the second codeword is performed using the first carrier but at a different time from transmitting at least part of the first codeword.

18. The method of claim 1 wherein:
transmitting at least part of the first codeword is performed using a first carrier; and
transmitting at least part of the second codeword is performed using the first carrier concurrently with the transmission of the first codeword and using a same physical resource.

19. The method of claim 1 wherein transmitting the first and second codewords are performed by a single transmitter.

20. The method of claim 1 further comprising:
transmitting signaling to indicate that transmitted codewords should together be treated as a turbo codeword.

21. A mobile device configured to perform the method of claim 1.

22. A network element configured to perform the method of claim 1.

* * * * *